United States Patent
Cosand

(10) Patent No.: US 6,628,220 B2
(45) Date of Patent: Sep. 30, 2003

(54) CIRCUIT FOR CANCELING THERMAL HYSTERESIS IN A CURRENT SWITCH

(75) Inventor: Albert E. Cosand, Agoura Hills, CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 10/066,011

(22) Filed: Jan. 31, 2002

(65) Prior Publication Data

US 2003/0141924 A1 Jul. 31, 2003

(51) Int. Cl.[7] .............................................. H03M 1/66
(52) U.S. Cl. ........................ 341/144; 341/119; 326/126
(58) Field of Search .......................... 326/126; 341/144, 341/119, 145

(56) References Cited

U.S. PATENT DOCUMENTS

| | | |
|---|---|---|
| 4,229,729 A | 10/1980 | Devendorf |
| 4,580,066 A | 4/1986 | Berndt |
| 5,781,035 A | 7/1998 | Tashibu |
| 5,790,060 A * | 8/1998 | Tesch .......................... 341/119 |

OTHER PUBLICATIONS

Data Sheet (one page), Analog Devices, "High Speed Active Load With Inhibit Mode," AD53041 1997.

* cited by examiner

*Primary Examiner*—Jean Bruner Jeanglaude
(74) *Attorney, Agent, or Firm*—Leonard A. Alkov; Glenn H. Lenzen, Jr.

(57) ABSTRACT

A current switch circuit including a current switch including a first transistor and a second transistor connected as a differential pair and receiving a differential logic signal at their bases, and logic signal controlling circuitry coupled to the first and second transistors for offsetting a transition starting point of to differential logic signal to offset a self-heating induced shift in a switching threshold of the current switch.

18 Claims, 2 Drawing Sheets

CIRCUIT FOR CANCELING THERMAL HYSTERESIS IN A CURRENT SWITCH

This invention was made with government support under Contract No. N66001-97-C awarded by the Department of the Navy. The Government has certain rights in this invention.

TECHNICAL FIELD OF THE DISCLOSURE

This invention relates to current switching techniques and more particularly to a circuit for canceling thermal hysteresis.

BACKGROUND OF THE DISCLOSURE

Current switches are utilized in various applications such as digital to analog converters (DACs). In an application where time of switching is important, a current switch is commonly driven directly from a clocked latch or flip-flop, and FIG. 1 is a schematic circuit diagram of a differential current switch 10 that is driven by the differential output OUT/OUTX of a high speed differential latch 20. Without loss of generality, this may be considered to be one bit of a current-output DAC. The current switch 10 comprises two differentially connected transistors Q9, Q10 which steer a current Idac into one or the other of complementary load terminals DACOUT, DACOUTX.

The differential latch 20 includes differentially connected transistors Q1, Q2 that receive the respective phases of a differential logical input D/DX at their base terminals, and which have their emitter terminals connected together. The collector terminals of the differential pair of transistors Q1, Q2 are respectively connected to the collector terminals of the differential pair of transistors Q4, Q3, and to the base terminals of emitter followers Q7, Q8. The emitter terminals of the emitter followers Q7, Q8 are respectively connected to current sources I2, I3, and comprise differential outputs OUT/OUTX of the latch 20. The emitter terminals of the emitter followers Q7, Q8 are further respectively connected to the base terminals of the differential pair of transistors Q3, Q4. A resistor R1 is connected between a supply voltage V+ and the node formed by the interconnection of the collector of the transistor Q1, the collector of the transistor Q3, and the base of the emitter follower Q7. A resistor R2 is connected between the supply voltage V+ and the node formed by the interconnection of the collector of the transistor Q2, the collector of the transistor Q4, and the base of the emitter follower Q8.

The differential pair of connected transistors Q5, Q6 receive the respective phases of a differential clock signal CLK/CLKX at their base terminals, and have their emitter terminals connected together to a current source I1. The collector terminal of the transistor Q5 is connected to the emitter terminals of the differential transistors Q1, Q2, while the collector terminal of the transistor Q6 is connected to the emitter terminals of the differential transistors Q3, Q4.

The power dissipation in the differentially connected switch transistors Q9, Q10 will be approximately (neglecting the base current) Idac times the collector-emitter voltage of the transistor that is switched on, and essentially zero in the other transistor. The thermal response of a transistor can be approximated by a thermal resistance and a thermal time constant, such that temperature rise of each transistor at any time is a function of the past sequence of times that the transistor has been turned on.

The threshold voltage about which the current switch switches from one state to the other is nominally at zero volts differential between the bases of the transistors Q9, Q10. However, the transistors Q9, Q10 are subject to differential heating due to the higher power dissipation in the transistor that is on and carrying the current. This in turn causes the threshold voltage for the switching to vary due to the temperature dependence of the base-emitter voltage. This effect is commonly referred to as "thermal hysteresis".

The shift in threshold voltage due to the self heating can be modeled as the product of the temperature difference between the two transistors of the switch and the temperature coefficient of the base-emitter voltage. The output transition of the latch that drives the switch has a finite slew rate; if the threshold voltage of the switch varies, the effective time of the switch transition will vary by an amount equal to the threshold voltage change divided by the slew rate of the latch output. Such a variation in the time of switching, depending on the previous pattern of switch transitions, distorts the output of the DAC. The distortion products thus produced can limit the spur-free dynamic range of the DAC.

A known technique for reducing the variation in the time of switching due to differential self heating involves attempting to drive a current switch differential transistor pair with a sufficiently high slew rate drive signal that the time variation due to thermal threshold shift is very short, and/or keeping power density in the switching transistors low so that the differential heating is minimized. Low power density is achieved by using larger devices, which necessarily have higher parasitic capacitance. Higher slew rates for the drive signal result in more coupling to the output of the drive signal through any parasitic device capacitance that is present.

SUMMARY OF THE DISCLOSURE

The disclosed invention is directed to a current switch circuit including a first transistor and a second transistor as a differential transistor pair connected as a current switch and receiving a differential logic signal at their bases, and logic signal controlling circuitry coupled to the first and second transistors for offsetting a transition starting point of the differential logic signal to offset a self-heating induced shift in a switching threshold of the current switch.

BRIEF DESCRIPTION OF THE DRAWING

These and other features and advantages of the present invention will become more apparent from the following detailed description of an exemplary embodiment thereof, as illustrated in the accompanying drawings, in which.

DETAILED DESCRIPTION OF THE DISCLOSURE

Figure 1:
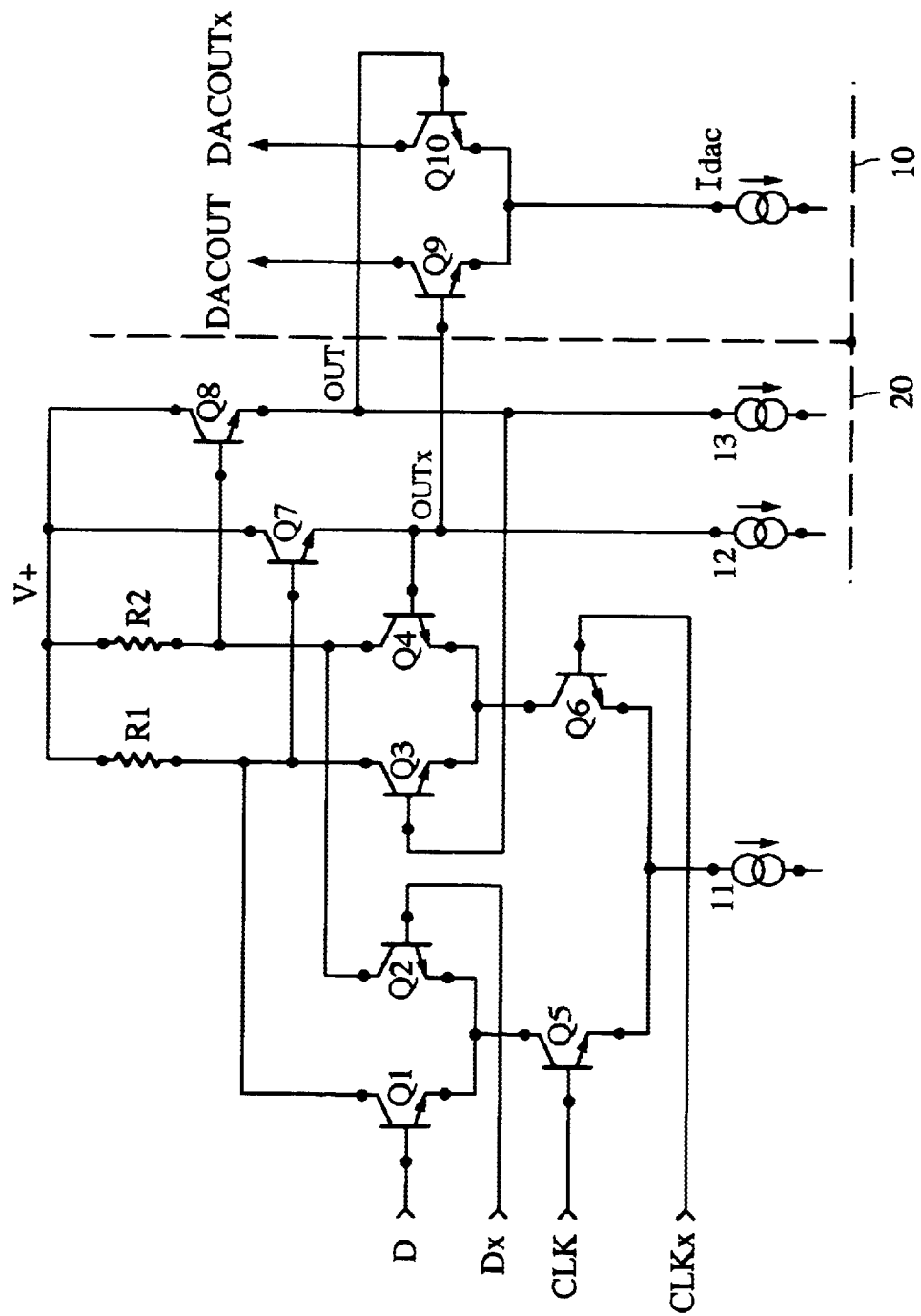
FIG. 1 is a schematic circuit diagram of a conventional latch and current switch circuit.
Figure 2:
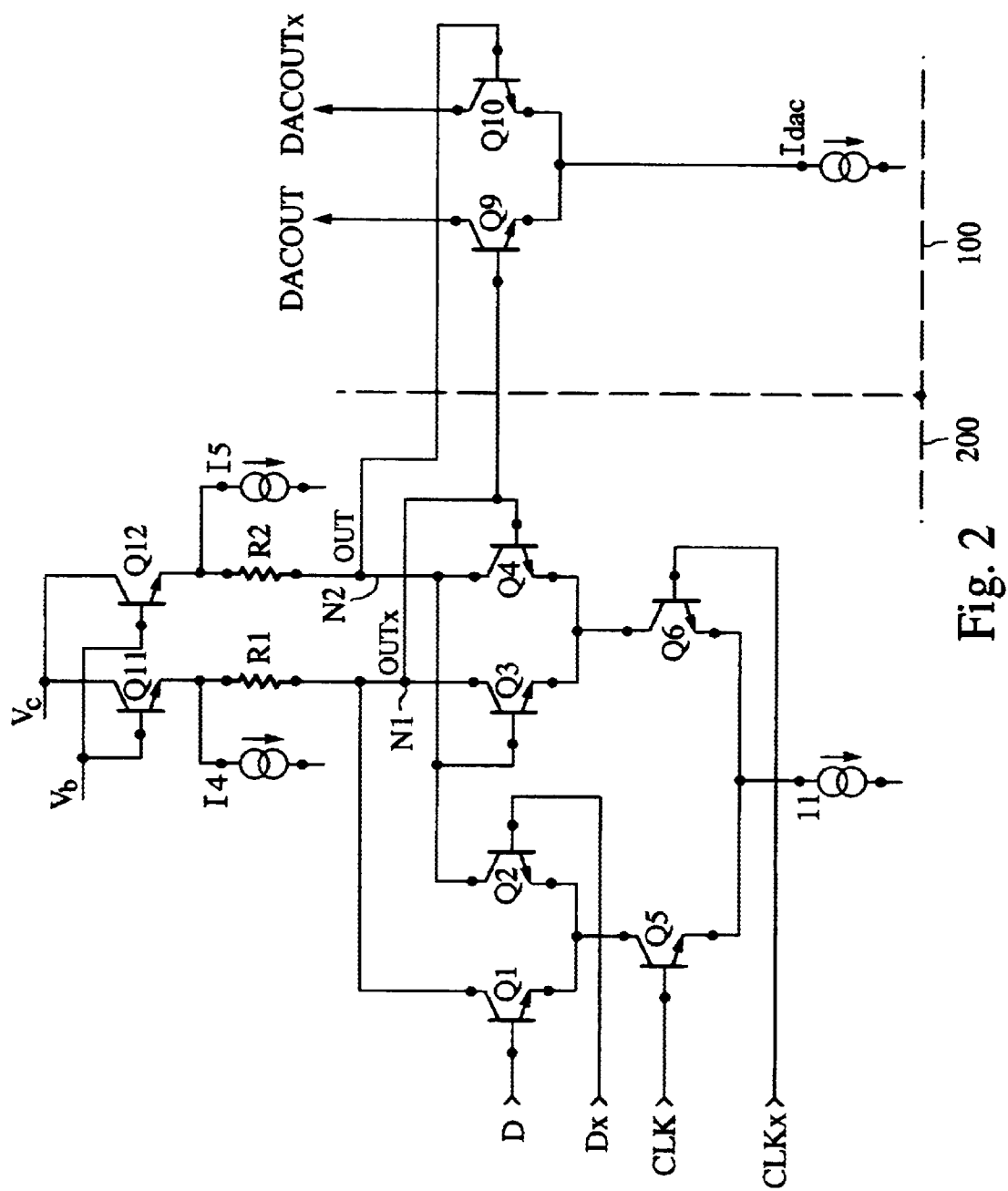
FIG. 2 is a schematic circuit diagram of a latch and current switch circuit that employs teachings in accordance with the invention.

FIG. 2 is a schematic diagram of an illustrative example of a latch and current switch circuit in accordance with the invention which includes a differential current switch 100 that is driven by a differential latch 200 having circuitry that compensates for thermal hysteresis of the differential current switch 100.

The differential latch 200 more particularly includes differential pair of transistors Q1, Q2 that receive the respective phases of a differential logical input D/DX at their base terminals. The collector terminals of the differential pair of transistors Q1, Q2 are respectively connected to collector terminals of transistors Q3, Q4 at nodes N1, N2. The collector terminal of the transistor Q3 is further connected to the base terminal of the transistor Q4 at the node N1, while the collector terminal of the transistor Q4 is further connected to the base terminal of the transistor Q3 at the node N2.

The emitters of the differential pair of transistors Q1, Q2 are connected together to the collector terminal of a transistor Q5 that is connected with a transistor Q6 as a differential pair. The emitters of the differential pair of transistors Q3, Q4 are connected together of the collector terminal of the transistor Q6. The differential pair of transistors Q5, Q6 receive the respective phases of a differential clock input CLK/CLKX at their base terminals, and have their emitters connected together to a current source I1.

A load resistor R1 is connected between the node N1 and the emitter terminal of a reference transistor Q11, while a load resistor R2 is connected between the node N2 and the emitter terminal of a reference transistor Q12. The base terminals of the reference transistors Q11, Q12 are connected to a voltage Vb, and the collector terminals of such transistors are connected to a voltage Vc. A "keep alive" current source I4 is connected to the node formed by the connection of the resistor R1 and the emitter terminal of the reference transistor Q11, and a "keep alive" current source I5 is connected to the node formed by the connection of the resistor R2 and the emitter terminal of the reference transistor Q12.

The respective phases of a differential output OUT/OUTX of the latch 200 are provided at the nodes N2, N1 which are respectively connected to the bases of the differential pair of transistors Q10, Q9 that comprise the current switch 100. In operation, the differential output OUT/OUTX follows the logic level of the differential input D/DX while the differential clock input CLK/CLKX is high/low respectively. When the clock input CLK/CLKX is low/high, the differential output OUT/OUTX maintain the logic state that the differential input D/DX had prior to the clock transition. That is, the data input is latched during the clock intervals when the clock input CLK/CLKX is low/high.

In operation, the reference transistor Q11 conducts current when the switch transistor Q10 conducts current, and the reference transistor Q12 conducts current when the switch transistor Q9 conducts current, so that Q11 and Q12 dissipate power and heat similarly, as do Q12 and Q9. The base emitter voltages of the transistors Q11 and Q10 change similarly, while the base emitter voltages of the transistors Q12 and Q9 change similarly. The reference transistors Q11, Q12 therefore produce a thermally generated offset voltage between their emitter terminals in series with the latch output at the nodes N1, N2 that has a polarity that tends to null the thermal offset in the switch transistors Q9, Q10.

Generally, the reference transistors Q11, 12 can be configured so that the voltage between the emitters thereof substantially matches the shift in the threshold voltage of the switch transistors Q9, Q10.

The reference transistors Q11, Q12 are more particularly configured and operated to closely replicate the thermal history of the switch transistors Q9, Q10 so as to generate a voltage at the emitters of the transistors Q11, Q12 that tends to track the shift in the threshold voltage of the current switch and has a polarity that tends to null the thermally induced shift in the threshold voltage of the switch transistors Q9, Q10. In particular, the sign of the voltage difference at the emitters of Q11 and Q12 is such as to offset the starting point of a logic transition that drives Q9 and Q10 so that substantially no change from the nominal switching time occurs as a result of the thermal offset voltage. The transistors Q11, Q12 therefore control the respective levels of the signals OUT, OUTX so that thermally induced shifts in the switching threshold do not change switching times. In this manner, the apparent switching threshold does not depend on the previous sequence of states (or "thermal history") of the current switch.

The thermal history of the switch transistors Q9, Q10 can be accurately replicated by configuring and operating the reference transistors Q11, Q2 at substantially the same power dissipation versus time characteristic as the switch transistors Q9, Q10. A very good approximation of the thermal history of the switch can be generated if the change versus time in power dissipation in the reference transistors Q11, !Q12 is substantially equal to the change versus time of the power dissipation in the switch transistors Q9, Q10. A somewhat less accurate approximation of the thermal history of the switch transistors Q9, Q10 can be obtained if the change in power density versus time in the reference transistors Q11, Q12 is substantially equal to the change in power density versus time in the switch transistors Q9, Q10.

By way of illustrative example, the sizes of the transistors Q11, Q12 are chosen relative to the values of I1 and Idac so that the change in power density in Q11 and Q12 equals the change in power density in transistors Q9 and Q10 when the switch changes state. Power density is the power dissipation divided by the active area of the transistor, where the power dissipated in a transistor is (neglecting the base current) the product of the emitter current and the voltage between the collector and the emitter. The area of the emitter is a fairly good approximation of the active area of a transistor. Change in power density as the logic state is switched is the difference in power dissipation between the two logic states divided by the active area of the transistor. Since the thermal resistance of a transistor is approximately inversely proportional to its active area, the power density is approximately proportional to the product of the power dissipation and thermal resistance, which is equal to the temperature rise. Changes in power density are responsible for the time variations in the temperature of a transistor, and consequently, changes in the threshold voltage of the current switch.

If the size scaling of the transistors is done in terms of identical unit transistors the thermal response will be the same for all the transistors. When the power is high in Q11 it will be low in Q9, and vice versa, and the same relation will hold for Q12 and Q10. A voltage differential will be developed between the emitters of the transistors Q11 and Q12 that will match the change in the switching threshold voltage of the transistor pair Q9 and Q10.

As another example, the transistors Q9, Q10, Q11, Q12 can have substantially equal switched current densities, and are operated at substantially the same collector-emitter voltage, so that they will track properly over temperature and power supply variations. The voltage Vc should therefore be set equal to the voltage to which Q9 and Q10 collectors are terminated in their load. The voltage Vb will then determine the collector-emitter voltage at which the transistors Q11, Q12 operate. the transistors Q9, Q10, Q11, Q12 can have substantially equal switched current densities and be operated at the same collector-emitter voltage. Current density in a transistor is the emitter current divided by the area of the emitter. If part of the current in a transistor is constant, and part of it varies as the logic state is switched, the switched current density is the change in current as the logic state is switched, divided by the emitter area.

The "keep-alive" currents I4 and I5 can be omitted, and are preferably equal and constant if implemented. These current sources serve to limit the voltage excursion at the emitter of whichever of the transistors Q11, Q12 is not carrying the latch current. The power dissipation from these currents may slightly heat both Q11 and Q12, but does not produce any temperature differential.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A current switch circuit comprising:
   a current switch comprising a first transistor and a second transistor connected as a differential pair, said first transistor having a base terminal, said second transistor having a base terminal, said current switch receiving a differential logic signal at said base terminals; and
   logic signal controlling circuitry for replicating a thermal history of said first transistor and said second transistor to generate an offset voltage substantially equal to a shift in a switching threshold voltage of said current switch that is induced by self heating of said first and second transistors, said offset voltage adjusting said differential logic signal so as to substantially null said shift, wherein said logic signal controlling circuitry comprises:
   a third transistor,
   a first load resistor connected between an emitter terminal of said third transistor and the base terminal of said first transistor,
   a fourth transistor, and
   a second load resistor connected between an emitter terminal of said fourth transistor and the base terminal of said second transistor; and
   wherein said third and fourth transistors are configured such that power dissipation versus time in said third and fourth transistors is substantially the same as power dissipation versus time in said first and second transistors.

2. The current switch circuit of claim 1 wherein said first, second, third and fourth transistors have substantially equal switched current densities and are operated at respective collector-emitter voltages that are substantially the same.

3. The current switch circuit of claim 1 wherein said logic signal controlling circuitry further comprises:
   a first current source connected to the emitter terminal of said third transistor; and
   a second current source connected to the emitter terminal of said fourth transistor.

4. A current switch circuit comprising:
   a current switch comprising a first transistor and a second transistor connected as a differential pair, said first transistor having a base terminal, said second transistor having a base terminal, said current switch receiving a differential logic signal at said base terminals; and
   logic signal controlling circuitry coupled to said first and second transistors for offsetting a transition starting point of said differential logic signal to offset a self-heating induced shift in a switching threshold of said current switch, wherein said logic signal controlling circuitry comprises:
   a third transistor,
   a first load resistor connected between an emitter terminal of said third transistor and the base terminal of said first transistor,
   a fourth transistor, and
   a second load resistor connected between an emitter terminal of said fourth transistor and the base terminal of said second transistor; and
   wherein said third and fourth transistors are configured such that power dissipation versus time in said third and fourth transistors is substantially the same as power dissipation versus time in said first and second transistors.

5. The current switch circuit of claim 4 wherein said first, second, third and fourth transistors have substantially equal switched current densities and are operated at respective collector-emitter voltages that are substantially the same.

6. The current switch circuit of claim 4 wherein said logic signal controlling circuitry further comprises:
   a first current source connected to the emitter terminal of said third transistor; and
   a second current source connected to the emitter terminal of said fourth transistor.

7. A current switch circuit comprising:
   a current switch comprising a first transistor and a second transistor connected as a differential pair, said first transistor having a base terminal, said second transistor having a base terminal, said current switch receiving a differential logic signal at said base terminals; and
   logic signal controlling circuitry for replicating a thermal history of said first transistor and said second transistor to generate an offset voltage substantially equal to a shift in a switching threshold voltage of said current switch that is induced by self heating of said first and second transistors, said offset voltage adjusting said differential logic signal so as to substantially null said shift, wherein said logic signal controlling circuitry comprises:
   a third transistor,
   a first load resistor connected between an emitter terminal of said third transistor and the base terminal of said first transistor,
   a fourth transistor, and
   a second load resistor connected between an emitter terminal of said fourth transistor and the base terminal of said second transistor; and
   wherein said third and fourth transistors are configured such that a change in power dissipation versus time in said third and fourth transistors is substantially the same as a change in power dissipation versus time in said first and second transistors.

8. The current switch circuit of claim 7 wherein said first, second, third and fourth transistors have substantially equal switched current densities and are operated at respective collector-emitter voltages that are substantially the same.

9. The current switch circuit of claim 7 wherein said logic signal controlling circuitry further comprises:
   a first current source connected to the emitter terminal of said third transistor; and
   a second current source connected to the emitter terminal of said fourth transistor.

10. A current switch circuit comprising:
    a current switch comprising a first transistor and a second transistor connected as a differential pair, said first transistor having a base terminal, said second transistor having a base terminal, said current switch receiving a differential logic signal at said base terminals; and logic signal controlling circuitry for replicating a thermal history of said first transistor and said second transistor to generate an offset voltage substantially equal to a shift in a switching threshold voltage of said current switch that is induced by self heating of said first and second transistors, said offset voltage adjusting said differential logic signal so as to substantially null said shift, wherein said logic signal controlling circuitry comprises:

a third transistor, a first load resistor connected between an emitter terminal of said third transistor and the base terminal of said first transistor, a fourth transistor, and a second load resistor connected between an emitter terminal of said fourth transistor and the base terminal of said second transistor; and wherein said third and fourth transistors are configured such that a change in power density versus time in said third and fourth transistors is substantially the same as a change in power density versus time in said first and second transistors.

11. The current switch circuit of claim 10 wherein said first, second, third and fourth transistors have substantially equal switched current densities and are operated at respective collector-emitter voltages that are substantially the same.

12. The current switch circuit of claim 10 wherein said logic signal controlling circuitry further comprises:

a first current source connected to the emitter terminal of said third transistor; and a second current source connected to the emitter terminal of said fourth transistor.

13. A current switch circuit comprising:

a current switch comprising a first transistor and a second transistor connected as a differential pair, said first transistor having a base terminal, said second transistor having a base terminal, said current switch receiving a differential logic signal at said base terminals; and logic signal controlling circuitry coupled to said first and second transistors for offsetting a transition starting point of said differential logic signal to offset a self-heating induced shift in a switching threshold of said current switch, wherein said logic signal controlling circuitry comprises:

a third transistor, a first load resistor connected between an emitter terminal of said third transistor and the base terminal of said first transistor, a fourth transistor, and a second load resistor connected between an emitter terminal of said fourth transistor and the base terminal of said second transistor; and wherein said third and fourth transistors are configured such that a change in power dissipation versus time in said third and fourth transistors is substantially the same as a change in power dissipation versus time in said first and second transistors.

14. The current switch circuit of claim 13 wherein said first, second, third and fourth transistors have substantially equally switched current densities and are operated at respective collector-emitter voltages that are substantially the same.

15. The current switch circuit of claim 13 wherein said logic signal controlling circuitry further comprises:

a first current source connected to the emitter terminal of said third transistor; and a second current source connected to the emitter terminal of said fourth transistor.

16. A current switch circuit comprising:

a current switch comprising a first transistor and a second transistor connected as a differential pair, said first transistor having a base terminal, said second transistor having a base terminal, said current switch receiving a differential logic signal at said base terminals; and logic signal controlling circuitry coupled to said first and second transistors for offsetting a transition starting point of said differential logic signal to offset a self-heating induced shift in a switching threshold of said current switch, wherein said logic signal controlling circuitry comprises:

a third transistor, a first load resistor connected between an emitter terminal of said third transistor and the base terminal of said first transistor, a fourth transistor, and a second load resistor connected between an emitter terminal of said fourth transistor and the base terminal of said second transistor; and wherein said third and fourth transistors are configured such that a change in power density versus time in said third and fourth transistors is substantially the same as a change in power density versus time in said first and second transistors.

17. The current switch circuit of claim 16 wherein said first, second, third and fourth transistors have substantially equal switched current densities and are operated at respective collector-emitter voltages that are substantially the same.

18. The current switch circuit of claim 16 wherein said logic signal controlling circuitry further comprises:

a first current source connected to the emitter terminal of said third transistor; and a second current source connected to the emitter terminal of said fourth transistor.

* * * * *

UNITED STATES PATENT AND TRADEMARK OFFICE
CERTIFICATE OF CORRECTION

PATENT NO. : 6,628,220 B2  Page 1 of 1
DATED : September 30, 2003
INVENTOR(S) : Albert E. Cosand It is certified that error appears in the above-identified patent and that said Letters Patent is hereby corrected as shown below:

Column 1,
Line 2, "N66001-97-C" should read "N66001-97-C-8004."

Signed and Sealed this

Seventh Day of September, 2004

JON W. DUDAS
*Director of the United States Patent and Trademark Office*